(12) United States Patent  (10) Patent No.: US 8,286,393 B2
Reyal et al.  (45) Date of Patent: Oct. 16, 2012

(54) BEARING FRAME FOR AN ELECTRICALLY ACTIVE PANEL SUCH AS A PHOTOVOLTAIC PANEL

(75) Inventors: Jean-Pierre Reyal, Eragny (FR); Yves Jautard, Vernet les Bains (FR)

(73) Assignees: Arcelormittal—Stainless and Nickel Alloys, Saint Denis (FR); Solarte, Ria Sirach (FR)

( * ) Notice: Subject to any disclaimer, the term of this patent is extended or adjusted under 35 U.S.C. 154(b) by 43 days.

(21) Appl. No.: 12/596,641

(22) PCT Filed: Apr. 17, 2008

(86) PCT No.: PCT/FR2008/050681
§ 371 (c)(1),
(2), (4) Date: Feb. 24, 2010

(87) PCT Pub. No.: WO2008/145898
PCT Pub. Date: Dec. 4, 2008

(65) Prior Publication Data
US 2010/0154327 A1  Jun. 24, 2010

(30) Foreign Application Priority Data
Apr. 20, 2007 (FR) ...................................... 07 54616

(51) Int. Cl.
*E04D 13/18* (2006.01)
*E04C 2/52* (2006.01)
(52) U.S. Cl. ...................................... 52/173.3; 52/220.1
(58) Field of Classification Search .................... 52/200, 52/22, 173.3, 251, 586.1, 586.2, 582.1, 656.1, 52/665; 136/244, 251; 126/704, 623; 403/292
See application file for complete search history.

(56) References Cited

U.S. PATENT DOCUMENTS

| 4,283,106 | A | | 8/1981 | Bunnell |
| 5,008,062 | A | * | 4/1991 | Anderson et al. ........ 264/272.15 |
| 5,497,587 | A | * | 3/1996 | Hirai et al. ................... 52/173.3 |
| 6,093,884 | A | * | 7/2000 | Toyomura et al. ............ 136/244 |
| 6,105,331 | A | * | 8/2000 | Rinklake et al. ............. 52/650.1 |
| 6,111,189 | A | * | 8/2000 | Garvison et al. .............. 136/244 |
| 6,119,415 | A | * | 9/2000 | Rinklake et al. ............. 52/173.3 |
| 6,182,404 | B1 | * | 2/2001 | Rinklake et al. ............. 52/173.3 |

(Continued)

FOREIGN PATENT DOCUMENTS
EP  0 325 369 A  7/1989
(Continued)

*Primary Examiner* — Mark Wendell
(74) *Attorney, Agent, or Firm* — Sughrue Mion, PLLC

(57) ABSTRACT

Supporting frame for an electrically active panel comprising a peripheral structure (1) for receiving an electrically active panel (20), the peripheral structure (1) of which comprises an internal electrical connection means (14) for connection to an electrically active panel (20) carried by the frame, at least one first external electrical connection means (16) for connection to a first means external to the frame, and electrical linking means (18) for electrically linking at least the internal electrical connection means (14) to at least the first external electrical connection means (16), the electrical linking means (18) extending along the peripheral structure so as to be concealed by the peripheral structure, the peripheral structure comprising a hollow portion (25) in which the electrical linking means (18) are received. The peripheral structure (1) is a framework consisting of tubular uprights (2, 3, 4, 5), the internal electrical connection means (14) and external electrical connection means (16, 17) extending through a wall of the uprights on which they are disposed and the electrical linking means (18) extending inside the tubular uprights.

31 Claims, 9 Drawing Sheets

U.S. PATENT DOCUMENTS

| | | | |
|---|---|---|---|
| 6,269,596 B1 * | 8/2001 | Ohtsuka et al. | 52/173.3 |
| 6,465,724 B1 * | 10/2002 | Garvison et al. | 136/244 |
| 6,670,541 B2 * | 12/2003 | Nagao et al. | 136/251 |
| 6,672,018 B2 * | 1/2004 | Shingleton | 52/173.3 |
| 6,959,517 B2 * | 11/2005 | Poddany et al. | 52/173.3 |
| 7,592,537 B1 * | 9/2009 | West | 136/251 |
| 7,774,998 B2 * | 8/2010 | Aschenbrenner | 52/173.3 |
| 2001/0050102 A1 | 12/2001 | Matsumi et al. | |
| 2002/0078991 A1 * | 6/2002 | Nagao et al. | 136/251 |
| 2003/0010372 A1 * | 1/2003 | Dinwoodie | 136/244 |
| 2003/0015637 A1 * | 1/2003 | Liebendorfer | 248/237 |
| 2003/0070368 A1 * | 4/2003 | Shingleton | 52/173.3 |
| 2004/0163338 A1 * | 8/2004 | Liebendorfer | 52/173.1 |
| 2006/0118163 A1 * | 6/2006 | Plaisted et al. | 136/251 |
| 2007/0102036 A1 * | 5/2007 | Cinnamon | 136/244 |
| 2008/0029144 A1 * | 2/2008 | Brazier et al. | 136/206 |
| 2009/0078299 A1 * | 3/2009 | Cinnamon et al. | 136/244 |

FOREIGN PATENT DOCUMENTS

| | | |
|---|---|---|
| EP | 1 120 837 A2 | 8/2001 |
| EP | 1 341 240 A1 | 9/2003 |
| GB | 2 391 704 A | 2/2004 |

* cited by examiner

BEARING FRAME FOR AN ELECTRICALLY ACTIVE PANEL SUCH AS A PHOTOVOLTAIC PANEL

CROSS REFERENCE TO RELATED APPLICATIONS

This application is a National Stage of International Application No. PCT/FR2008/050681 filed Apr. 17, 2008, claiming priority based on French Patent Application No. FR 07 54616, filed Apr. 20, 2007, the contents of all of which are incorporated herein by reference in their entirety.

BACKGROUND OF THE INVENTION

The invention relates to a supporting frame for a panel comprising a peripheral structure for receiving an electrically active panel such as a photovoltaic cell panel. This supporting frame for a panel is intended, in particular, for supporting electrically active panels disposed on a wall of a building such as a roof or a façade.

In order to equip buildings such as houses with electricity generators which employ solar energy, sets of panels consisting of a plurality of photovoltaic cells are disposed, for example, on the roof of these buildings.

These panels generally consist of a stack of differing layers of glass, silicon, conductors and polymers. The sides of the generally square silicon cells can be as great as 200 mm. The cells are connected in series then bonded between two sheets of glass or between one sheet of glass and differing layers of polymer. By way of example, a module having a nominal voltage of 12 V is generally constructed by connecting 36 monocrystalline or polycrystalline cells in series. These assemblies of 36 cells are then connected in parallel. 72 silicon cells are thus used in the case of a 24 V module.

The front face of panels or modules of this type consists of glass, is directed toward the sun and allows radiation to pass through in such a way that it can interact with the silicon cells and generate electricity. This glass plate also has the function of protecting the photovoltaic cells from differing impacts. The back face of the modules or panels may be either opaque, consisting of a complex stack of polymers for protecting the cells from mechanical attack and corrosion, or transparent, in which case the front face is a glass plate.

These photovoltaic modules or panels are disposed on frameworks of which the uprights generally consist of connected aluminium profiles to impart mechanical strength thereto and to enable them to be fixed to the roof. In addition, the panels are connected to one another and to a distribution circuit for powering electrical loads.

In general, the connections are made at the back of the photovoltaic panels via bundles of cable extending below the photovoltaic panels. If the photovoltaic panels are transparent, these bundles of cable are particularly unsightly, and this is a drawback, in particular if the photovoltaic panels are to be placed on the façade of the building. In fact, transparent panels of this type may be used as means of ornamentation, and the presence of visible bundles of cable behind them, through the transparency, makes these panels unsuitable for such a use.

This problem may also be encountered with other electrically active panels such as electroluminescent panels or panels which may comprise elements such as flat screens.

In addition, the aluminium frameworks are fairly bulky owing to the poor mechanical properties of aluminium, and they may have corrosion characteristics which are not always satisfactory. The positioning thereof and, in particular, the production of the electrical connections are also labour-intensive.

Finally, in the event of heavy snowfall, aluminium frameworks may be pulled out by sliding sheets of snow.

SUMMARY OF THE INVENTION

It is the object of the present invention to overcome these drawbacks by proposing means for supporting electrically active panels such as photovoltaic panels or modules which allow connections to be made easily and without adversely affecting the appearance of the surfaces consisting of these sets of panels.

The invention accordingly relates to a supporting frame for an electrically active panel comprising a peripheral structure for receiving an electrically active panel. The peripheral structure comprises an internal electrical connection means for connection to an electrically active panel carried by the frame, at least one first external electrical connection means for connection to a first means external to the frame, and electrical linking means for electrically linking at least the internal electrical connection means to at least the first external electrical connection means, the electrical linking means extending along the peripheral structure so as to be concealed by the peripheral structure.

Preferably, the peripheral structure comprises a hollow portion in which the electrical linking means are received.

The peripheral structure is for example a framework consisting of tubular uprights, the electrical connection means extending through the wall of the uprights on which they are disposed and the electrical linking means extending inside the tubular uprights.

The uprights can comprise a groove extending along one of their generatrices, oriented towards the interior of the framework and intended to receive the edge of an electrically active panel.

At least one upright can comprise, over its entire length, a flap extending toward the exterior of the framework.

Preferably, the central portion of the frame delimited by the peripheral structure is open.

Preferably, the frame consists of a metal strip, for example of steel, which is cut out, folded and joined by welding.

Preferably, the metal strip consists of a stainless alloy and/or an alloy having a coefficient of expansion compatible with glass.

Preferably, the frame comprises two external electrical connection means each comprising at least two terminals and preferably three terminals, and the internal electrical connection means comprises two terminals, each terminal of the internal electrical connection means being linked to a terminal of each of the external electrical connection means and each terminal of an external electrical connection means not linked to a terminal of the internal electrical connection means is electrically linked to a terminal of the other external electrical connection means not linked to a terminal of the internal electrical connection means.

The internal electrical connector can comprise resilient female half-loops for receiving male connecting studs provided in the slice of an active electrical panel.

The electrically active panel is, for example, a photovoltaic generator.

The invention also relates to an external wall of a building which comprises a plurality of frames disposed side by side. At least two adjacent frames are connected to one another by an external electrical linking means which cooperates on the one hand with an external electrical connection means of a frame and on the other hand with an external connection means of the other frame.

At least one frame carries an electrically active panel which is, for example, a photovoltaic generator.

The external wall of a building forms, for example, a roof element.

BRIEF DESCRIPTION OF THE DRAWINGS

The invention will now be described in a more specific but non-limiting manner with reference to the accompanying figures, in which.

DETAILED DESCRIPTION OF THE INVENTION

Figure 1:
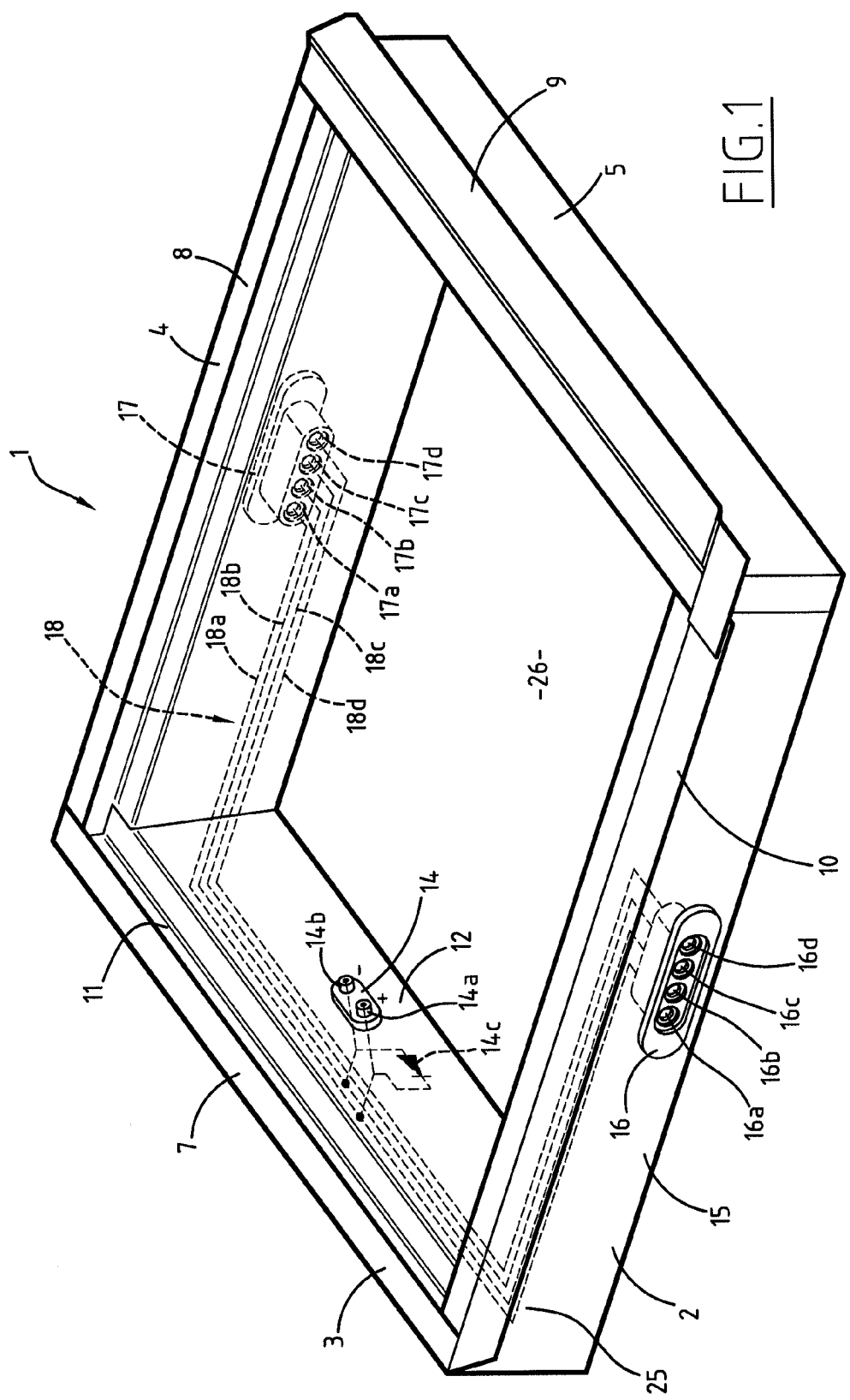
FIG. 1 is a perspective view of a frame for supporting an electrically active panel.
Figure 2:
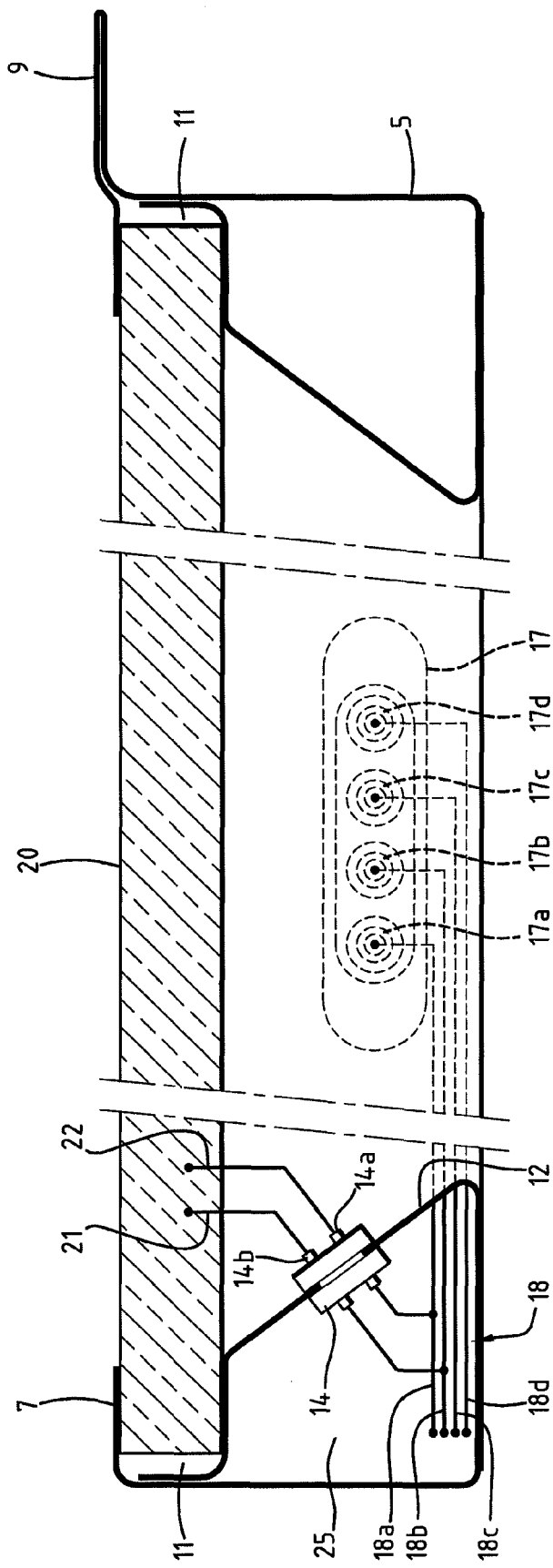
FIG. 2 is a section of the frame in FIG. 1 on which an electrically active panel is mounted.

The supporting frame for an electrically active panel comprises a peripheral structure which is generally denoted by 1 in FIG. 1 in the form of a rectangular framework consisting of four uprights 2, 3, 4, 5. At their upper portions, these uprights comprise horizontal flaps 7, 8, 9, 10 which are folded inwardly and delimit at the periphery of the framework a groove 11 for receiving an electrically active panel such as a photovoltaic cell panel. Two of the flaps 9, 10 also extend toward the exterior of the framework so as to form fins for producing a seal between two adjacent frames.

Each upright 2, 3, 4, 5 of the framework forming the peripheral structure is hollow and is produced in the manner described hereinafter by folding a metal strip so that it can receive electrical connection means.

The internal wall 12 of the upright 3 includes a connector 14 comprising two studs 14a and 14b for the connection of an electrically active panel which is supported by the frame. In particular, if this electrically active panel is a photovoltaic cell 20, the positive and negative connections 21 and 22 of the photovoltaic panel can be connected to the studs 14a and 14b of the connector 14. This connector 14 is, for example, a connector comprising a body made of plastics material overmoulded in a hole provided on the face 12 of the upright 3.

The external face of the upright 2 which is perpendicular to the upright 3, comprises an external connection means 16 which is also overmoulded in a hole provided on the wall 15 of the upright 2. This external connection means comprises four connecting studs 16a, 16b, 16c and 16d. Similarly, the external wall of the upright 4 opposite the upright 2 (not shown in the figure) is provided with a second external connection means 17 which is also overmoulded and also comprises four connecting studs 17a, 17b, 17c and 17d.

The differing studs of the external connection means 16 and 17 and of the internal connection means 14 are connected to one another by an electrical linking means 18. This electrical linking means comprises a first connecting cable 18a which links a first connecting stud 16a of an external connection means 16 and the first connecting stud 17a of the external connection means 17 and which is also connected to a first connecting stud 14a of the internal connection means 14.

A second connecting cable 18b links the second stud 16b of the external connection means 16, the second stud 17b of the external connection means 17 and the second connecting stud 14b of the internal connection means 14.

A third cable 18c directly links the third connecting stud of the external connection means 16 to the third stud 17c of the second means of the external connection means 17.

Finally, a fourth connecting cable 18d directly links the fourth connecting stud 16d of the external connection means 16 to the fourth stud 17d of the external connection means 17.

These last two connecting circuits are not connected to the internal connection means 14.

In addition, the positive internal connector 14a and negative internal connector 14b may be connected via a diode 14c which is oriented so as to block the passage of current from the positive connector to the negative connector and to allow the passage of current in the opposite direction. This diode allows a defective photovoltaic panel to be bypassed, if necessary.

These connecting circuits are located inside the hollow uprights and are therefore completely concealed.

The internal connection means, external connection means and connecting circuits between these differing connection means enable sets of panels to be interconnected, as will be described hereinafter, so as to produce series connections or parallel connections, for example in the case of electricity generating panels.

As mentioned hereinbefore, the uprights 2, 3, 4 and 5 constitute a framework which forms the hollow peripheral structure surrounding a central portion 26 which is generally open. However, there is nothing to prevent this central portion 26 from being closed by a panel.

With this arrangement, the electrical linking means 18 is completely received in a hollow portion 25 of the framework formed by the interior of the tubular uprights and is thus concealed.

In addition to the electrical links required for the load of the photovoltaic panels, the frame can incorporate an electrical heating means (not shown) for maintaining the frame at a temperature greater than 0° C., preferably greater than 7 or 8° C.

This heating means which in a known manner can consist of an electrical heating element controlled by a temperature detector is useful in the winter for detaching snow which might obscure the panels.

The internal electrical connection means 14, as shown, is suitable for the connection of photovoltaic panels comprising two electrical linking wires.

A thimble fixed directly on the frame and allowing the earthing thereof can also be provided.

Figure 13:
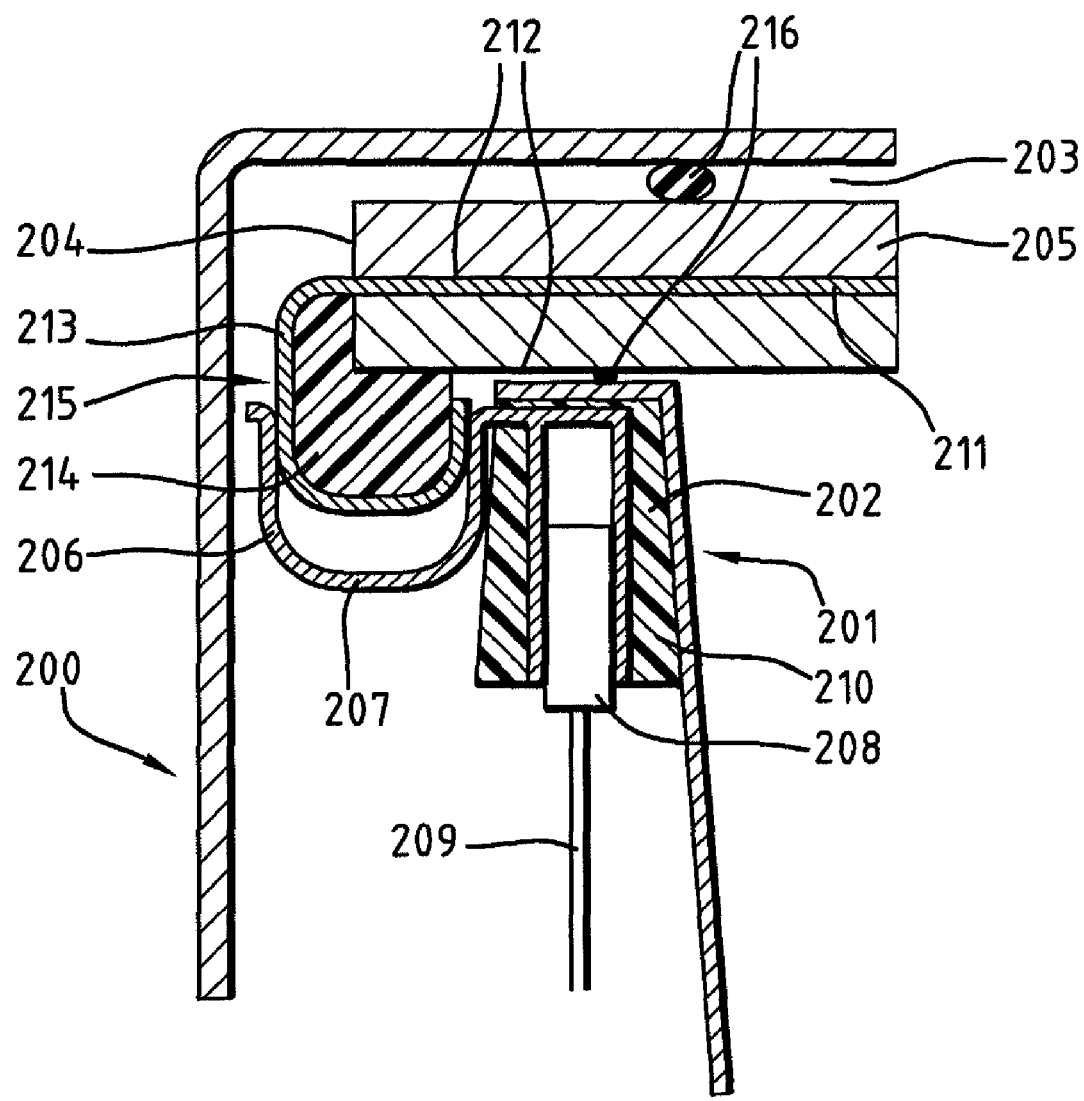
FIG. 13 is a section through an embodiment for connecting an electrically active panel to an internal connection means of a frame.

Further internal electrical connection means may be considered. A particular embodiment of such a method of connection, shown in FIG. 13, will now be described.

The upright 200 of the frame comprises an internal connector 201 incorporated in the lower face 202 of the groove 203 which receives the edge 204 of the photovoltaic panel 205. Resilient seals 216 are disposed between the photovoltaic panel and the lower and upper faces of the groove 203. These resilient seals have the function of sealing and of allowing the displacements resulting from differential expansion.

The connector 201 consists of at least two thimbles 206 (only one of which is shown in the figure) made of conductive material and each comprising a resilient female half-loop 207 and a stud 208 for linking to an electrical conductor 209. The two or three thimbles are immersed in a coating 210 made of plastics material and intended to fix the thimbles on the wall of the upright of the framework.

The photovoltaic panel 205 comprises an active slice 211 confined between two protective supporting plates 212. The active slice 211 is extended at the exterior by two or three conductive strips 213 made of copper (only one of which is shown in the figure) which are wound round a body made of plastics material 214 so as to form a male connecting stud 215 adapted to be clipped into the female loops 207 of the thimbles 206 of the connector 201 of the framework.

The internal connector 201 and the male connecting stud 215 are adapted so that, when the male connecting stud 215 is plugged in the internal connector 201, each conductive strip 213 of the photovoltaic panel is in electrical contact with a resilient female half-loop of the internal connector.

It will be appreciated that the connecting device comprises at least one thimble for the positive pole and one thimble for the negative pole.

Figure 3:
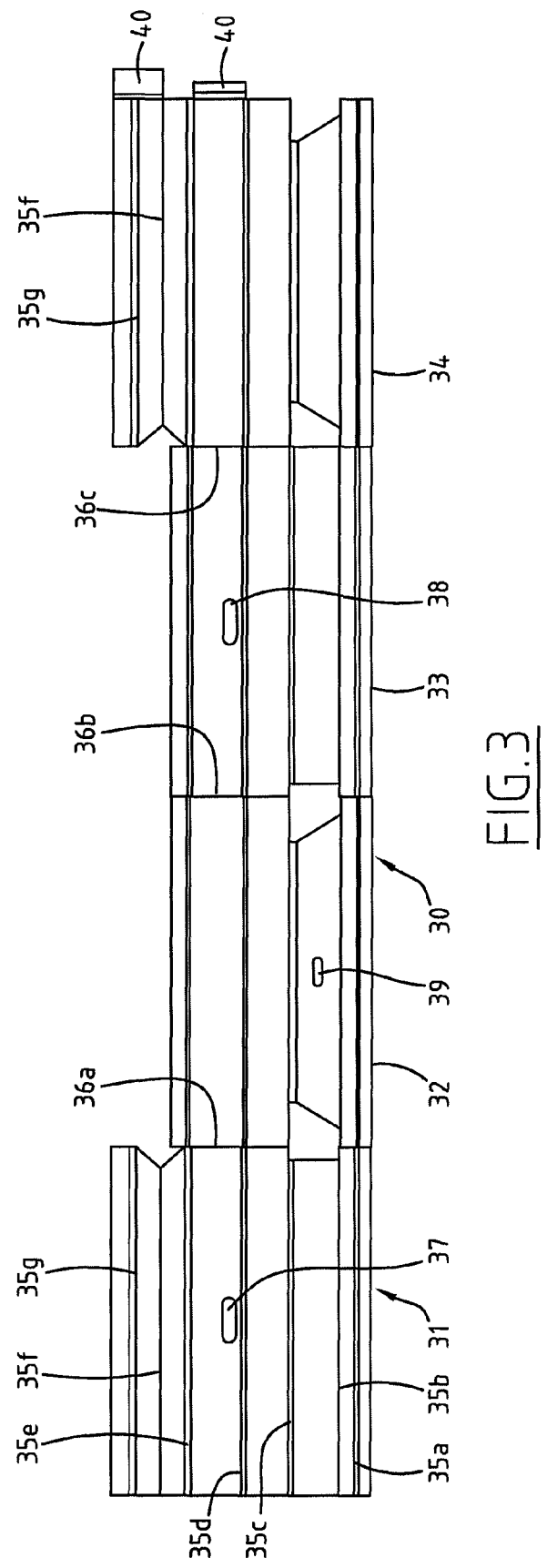
FIG. 3 is a schematic view of a cut-out pre-folded metal strip for the production of a supporting frame for an electrically active panel as shown in FIG. 1.

In order to produce a supporting frame for a panel comprising a hollow peripheral structure such as that just described, a metal strip 30 (shown in FIG. 3) is used, which is precut and comprises four panels 31, 32, 33, 34 which are separated by vertical fold lines 36a, 36b and 36c and are each intended, after being folded, to form the uprights 2, 3, 4 and 5 respectively. This strip 30 comprises horizontal fold lines 35a, 35b, 35c, 35d, 35e, 35f and 35g which extend over the entire length of the strip and will enable folds to be made so as to form tubular units. The metal strip comprises at least one welding lug 40'.

The panel 31 comprises an opening 37 for receiving the external connection means 16.

The panel 32 comprises an opening 39 for receiving the internal connection means 14.

The panel 33 comprises an opening 38 for receiving the external connection means 17.

Figure 4:
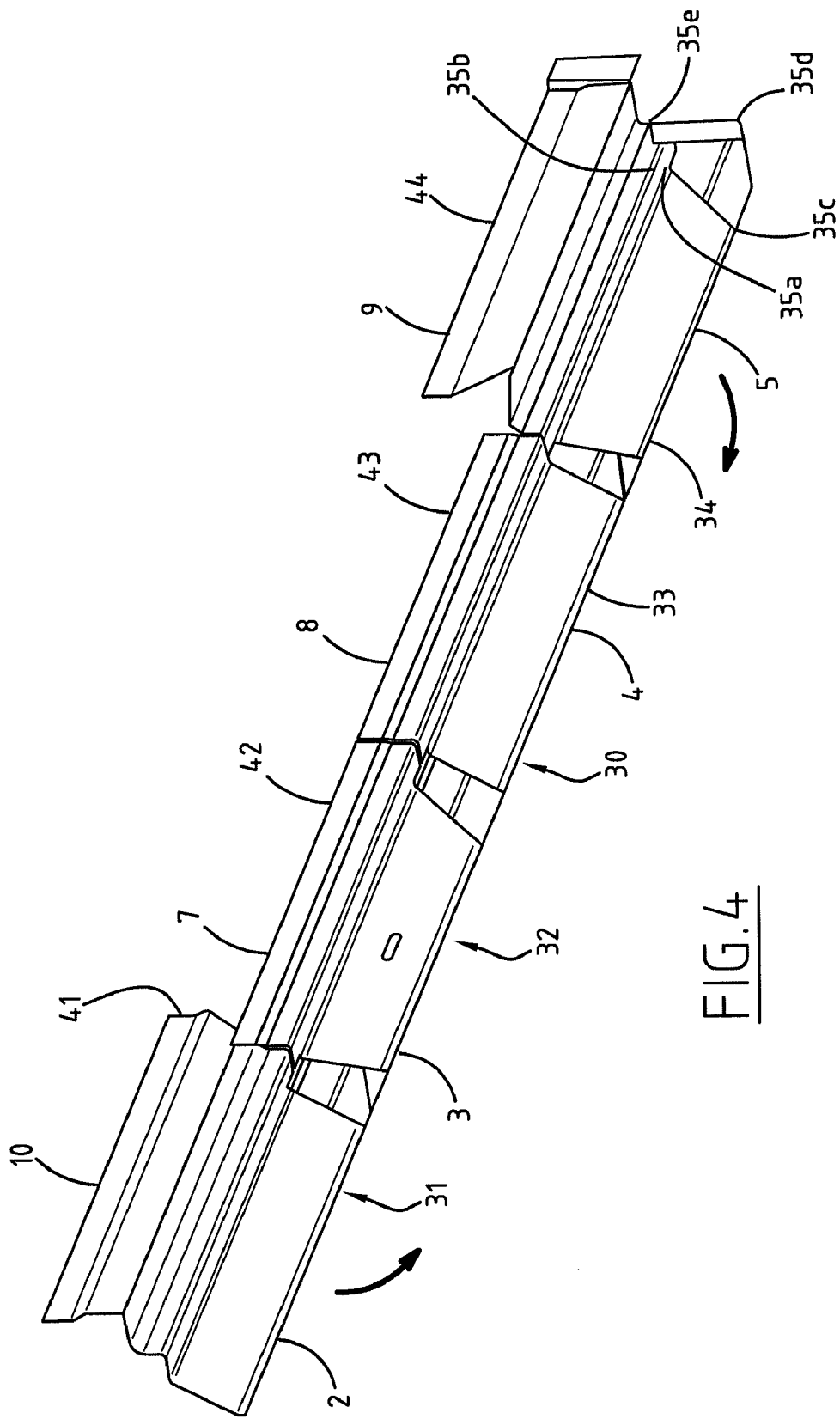
FIG. 4 is a perspective view of an intermediate phase of production of a frame for supporting an electrically active panel by means of a metal strip as shown in FIG. 3.
Figure 5:
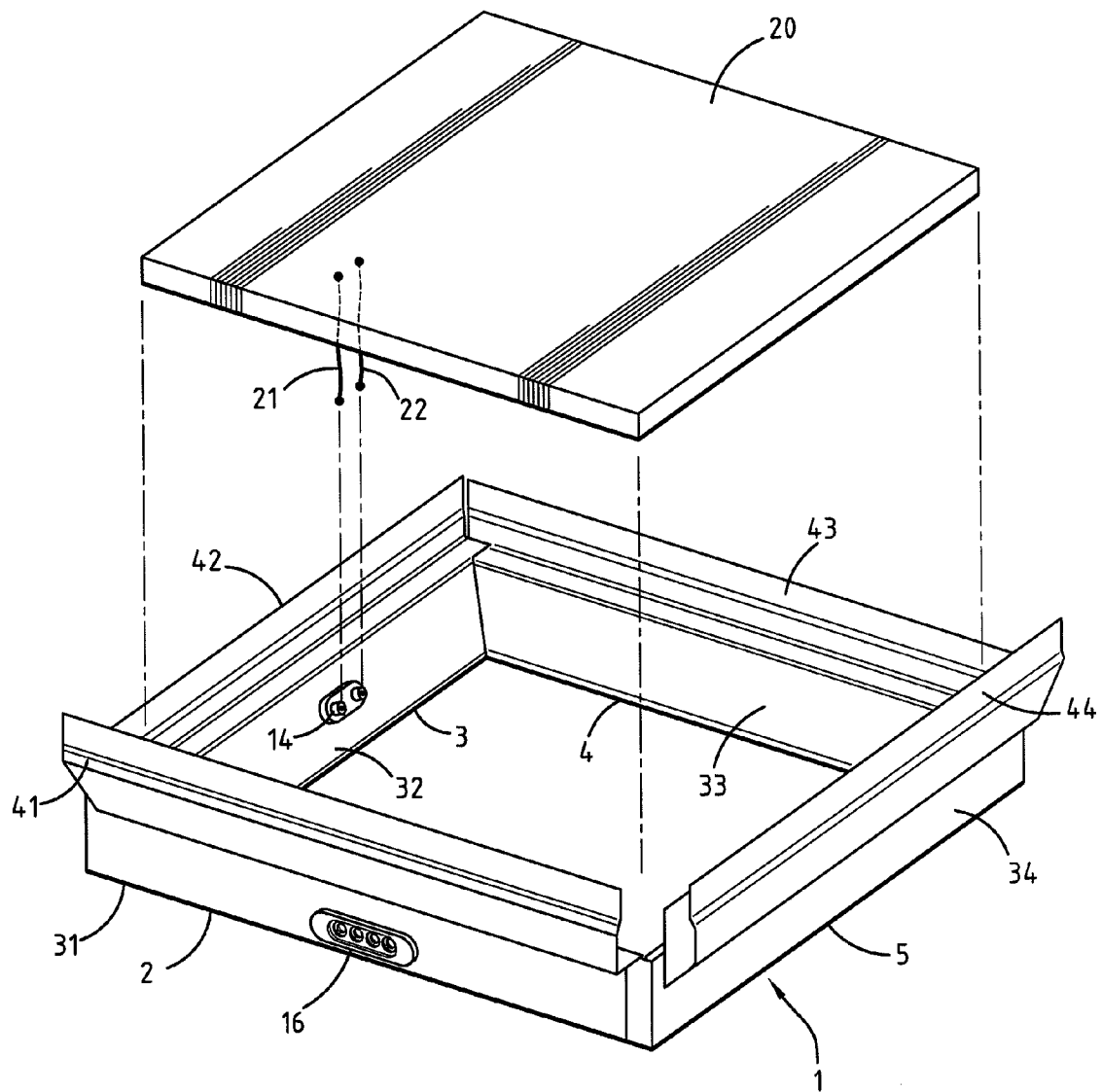
FIG. 5 is an exploded view of a frame for supporting an electrically active panel on which an electrically active panel is mounted.

As shown in FIG. 4, in an intermediate phase of production, the precut strip 30 may be folded along longitudinal fold lines 35a, 35b, 35c, 35d, 35e, in particular to form tubular units corresponding to the panels 31, 32, 33 and 34. This unit can then be folded round vertical fold lines 36a, 36b, 36c (not shown in the figure) so as to form a closed structure of generally rectangular shape.

The panels comprise aprons 41, 42, 43, 44 which, after being folded, can form flaps 10, 7, 8 and 9 respectively.

After being folded, the panels are obviously fixed by welding so as to form a rigid structure.

A method of producing such frameworks by folding a precut and prefolded metal strip is known per se and described, for example, in the patent application FR 00 09334.

This method has the advantage of allowing the production of very light but at the same time extremely rigid frameworks or hollow structures. This method also allows the production of such structures to be easily automated. It will be noted that, in particular when the framework to be produced is very large, it is possible to use not just a single strip but a plurality of strips. Each strip is used to produce a framework portion and the differing portions are then assembled.

To produce a framework, a precut strip with prefold lines and the necessary stamping is first prepared. The connectors which are overmoulded on the panels 31, 32 and 33 are then positioned. The set 18 of connecting cables is then laid.

Profiled tubes are produced by folding and the cables are located inside the tube.

Longitudinal laser welding is carried out.

The four segments of tubes are then folded along the link lines so as to close the framework and the assembly is joined together by laser welding, in particular at the welding lug 40'.

The person skilled in the art is familiar with this method of production.

Once the structure just described has been produced so as to form a rectangular unit with aprons 41, 42, 43 and 44, it can receive an electrical panel such as a photovoltaic panel 20 which is placed inside the framework and is connected by connecting the electrical output conductors 21 and 22 of the photovoltaic cell to the studs 14a and 14b of the internal connection means 14. Once the photovoltaic panel is disposed inside the framework and connected, the aprons 41, 42, 43 and 44 may be folded down and welded at the four corners so as to hold the panel 20 securely in the framework or on the frame.

In order to be able to support photovoltaic panels which are subjected to weathering, under good conditions, the metal strip must consist of an alloy which has high mechanical characteristics, a coefficient of expansion which is preferably compatible with glass and preferably high resistance to atmospheric corrosion. The aim of choosing a coefficient of expansion which is compatible with that of glass is to prevent shearing of the seals disposed at the junction between the frames and the photovoltaic panels.

The alloy may be, for example, of the type N485 defined in the standard ISO 63 72, of which the coefficient of expansion of approximately $9.1 \times 10^{-6}$/K between 0 and 100° C. is close to that of glass and of which the elastic limit is of the order of 250 MPa. If the framework is produced with this alloy, of which the chemical composition basically comprises about 48% of nickel, 6% of chromium and 45% of iron, it must be protected from corrosion.

The alloy may also be a stainless steel of the type 316, for example as defined in the standard NF EN 10088-2, of which the coefficient of expansion of approximately $16 \times 10^{-6}$/K between 0 and 100° C. is higher than that of glass and the elastic limit is approximately 200 MPa. This steel, which contains about 18% of chromium, 10% of nickel and 3% of molybdenum has a very high resistance to corrosion. Owing to its high coefficient of expansion, however, it is necessary to dispose an elastomeric seal between the photovoltaic panel and the framework in order to compensate for expansion gaps.

A further alloy which may be used is the steel F18 MT defined in the standard NF EN 10088-2 of which the coefficient of expansion of approximately $10.8 \times 10^{-6}$/K between 0 and 100° C. is close to that of glass, of which the elastic limit is approximately 220 MPa in the softened state and of which the corrosion resistance is acceptable. This steel contains approximately 18% of chromium, 2% of molybdenum and 0.5% of titanium and/or niobium.

This list of possible alloys is not exhaustive, and the person skilled in the art can select the alloy which he deems to be best suited to each particular application.

In particular, a conventional steel of the carbon steel type may be used.

On the other hand, the use of aluminium alloys is not preferred because these alloys do not allow sufficient rigidity to be obtained.

As mentioned hereinbefore, frames of this type equipped with photovoltaic panels may be installed on walls of a building, in particular on a roof pan. These panels are mounted and fixed using suitable fixing means which produce a seal and which can consist of stringers, bolts and seals (not shown), but which may for example be the same as the supporting means used to fix supporting frameworks for photovoltaic panels known from the prior art.

The panels which are mounted on a wall of a building therefore have to be connected to one another so as to be linkable to a load of photographically supplied energy in the case of panels.

Figure 6:
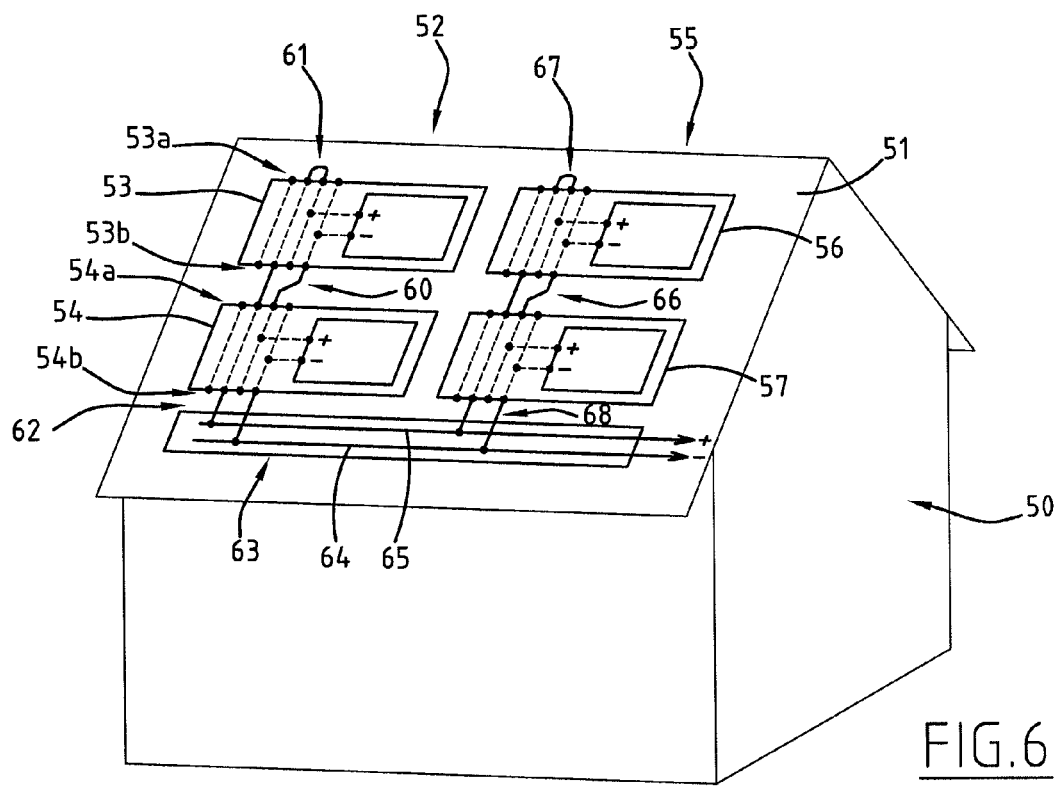
FIG. 6 is a schematic view of a method of connecting a set of photovoltaic panels mounted on the roof of a building.

FIG. 6 shows a first embodiment of an assembly. In this figure, a first group 52 of two panels 53, 54 mounted in series and a second group 55 of two panels 56 and 57 also mounted in series is provided on the roof 51 of the building 50. The two groups of panels 52 and 55 are connected in parallel to a circuit 63 for powering a load. To produce an assembly of this type, the external connection means 53a of the panel 53 located at the end of the group 52 comprises a connection means 61 for connecting a circuit linked to the positive pole of the photovoltaic generator of the panel 53 to a return circuit.

Similarly, the external connector 53b of the framework 53 and the external connector 54a of the panel 54, which face one another, are connected by an intermediate connection means 60 which enables the positive pole of the generator of the panel 54 to be connected to the negative pole of the generator of the panel 53, and the return circuit of the panel 53 to the return circuit of the panel 54.

Finally, the external connection means 54b of the panel 54 is linked via an intermediate connection means 62 to the circuit for powering a load 63 in such a way that the negative pole of the generator of the panel 54 is linked to a negative pole of the load circuit, and the return circuit which is connected to the positive pole of the generator of the panel 53 is linked to the positive pole of the load circuit.

Similarly, the group 55 of two panels 56 and 57 comprises end connection means 67 and intermediate connection means 66 and 68 which allow the two generators to be connected in series and to be connected to the load circuit in parallel with the generator formed by the panels 53 and 54.

The load circuit comprises a line 64 corresponding to the negative pole and a line 65 corresponding to the positive pole.

Assemblies of this type are known to the person skilled in the art.

Figure 7:
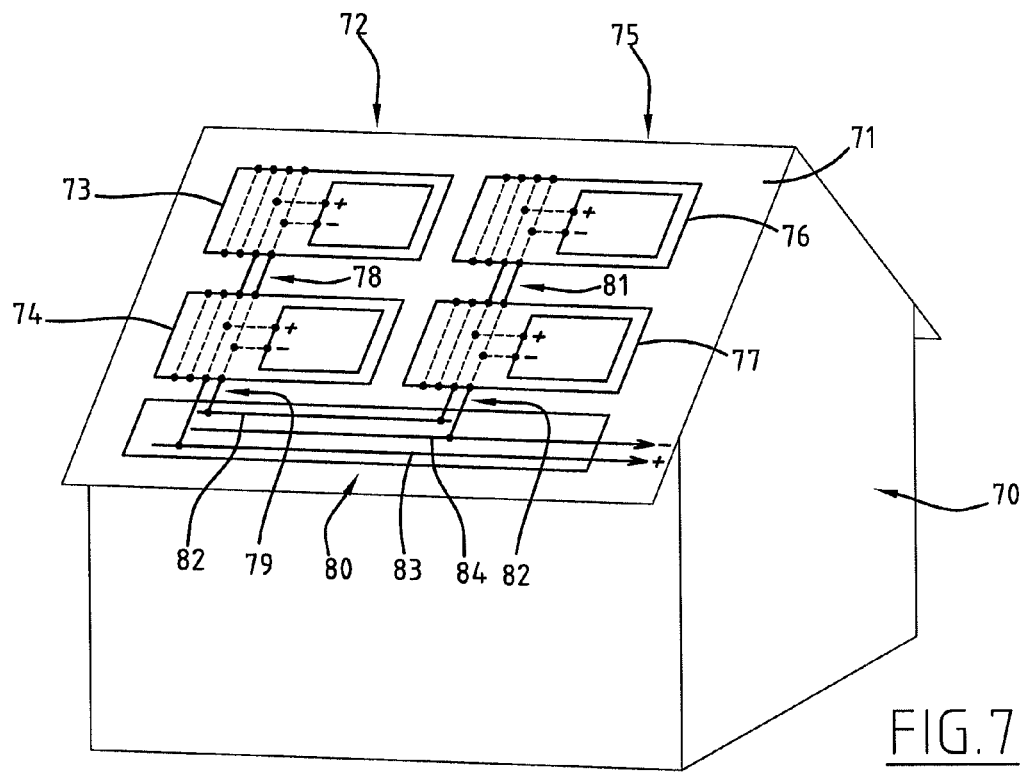
FIG. 7 is a schematic view of a second method of connecting a set of photovoltaic panels mounted on a roof of a building.

In a second embodiment, shown in FIG. 7, a first group 72 of panels 73 and 74 which are connected in parallel and a second group 75 of panels 76 and 77 which are also connected in parallel is disposed on the roof 71 of a building 70. The panels 73, 74 are connected in parallel via an intermediate connector 78. Similarly, the panels 76, 77 are connected in parallel via a connector 81.

Sets of panels 72 and 75 are connected in series with the load circuit via connectors 79 and 82 which link them on the one hand to a line 82 for connection of the positive poles of the unit 75 to the negative poles of the unit of panels 72. A line 83 corresponding to the positive pole of the load circuit is linked to the positive pole of the panels 73 and 74 via a connector 79.

A line 84 corresponding to the negative pole of the load circuit is linked via the connector 82 to the negative pole of the panels 76 and 77.

Assemblies of this type, which are given by way of non limiting example, are also known to the person skilled in the art.

In particular, junctions must be provided for earthing the frames.

Figure 8:
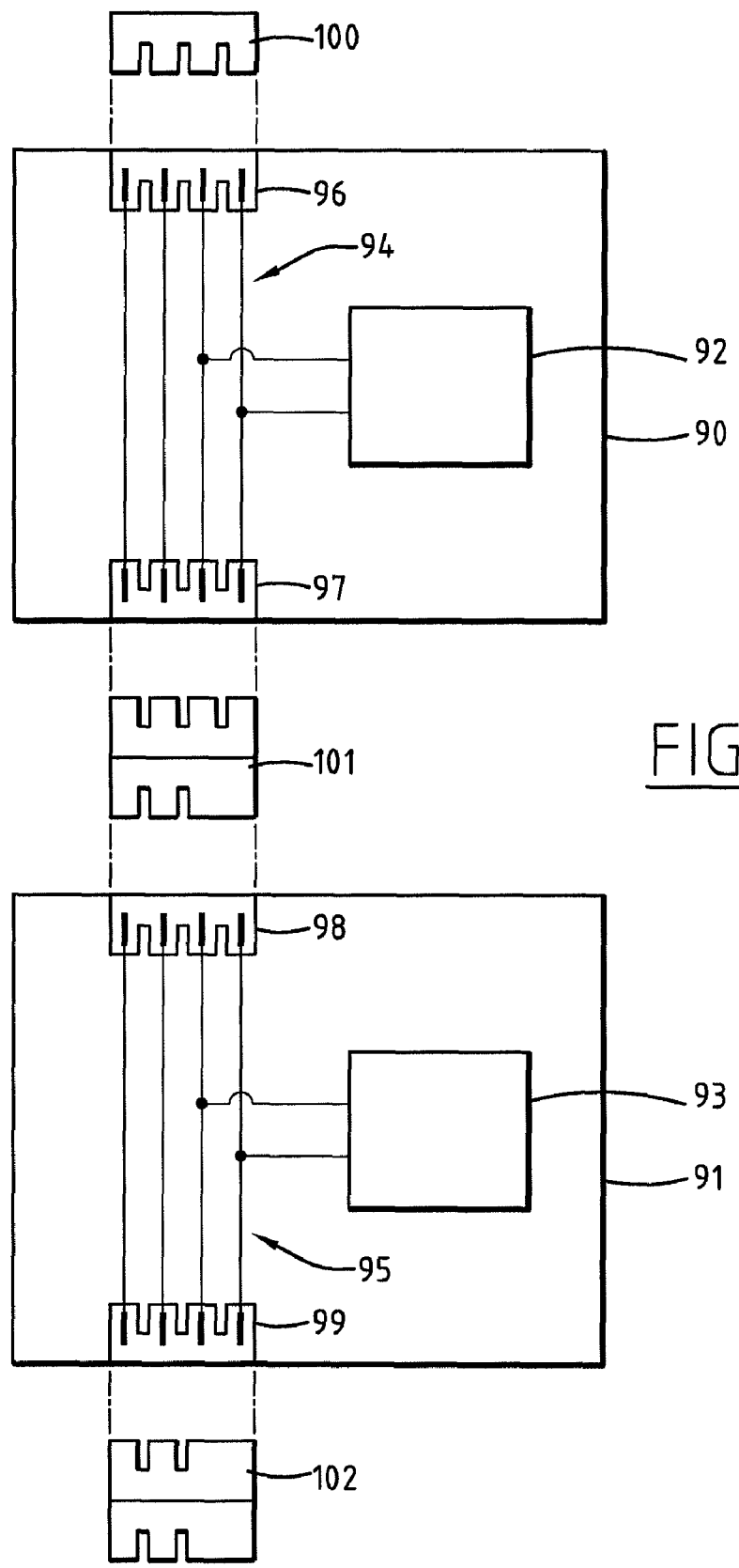
FIG. 8 is a schematic view of the means of connecting two adjacent photovoltaic panels intended to be mounted on the wall of a building.

These assemblies are shown schematically in FIG. 8 which shows two panels 90 and 91 each comprising generator elements 92 and 93 and internal connection cables 94 and 95 for linking the generator of the panel 90 to external connection means 96 and 97, and the generator of the panel 91 to external connection means 98 and 99. The external connection means 96 of the panel 90 receives an end connection means 100 which is plugged in the external connection means 96. This end connection means produces the junction between a pole of the generator 92 and the return circuit, if required, as in the case of the above-described first embodiment.

The two external connection means 97 and 98 of the panels 92 and 91 which face one another are connected via an external electrical linking means 101 which can be plugged on the one hand in the connection means 97 and on the other hand in the connection means 98 to produce the link between the two panels by the method shown in the above described first embodiment or second embodiment.

Finally, the external connection means 99 of the panel 91 comprises a connection means 102 for connection to the circuit for powering the load using the electricity supplied.

These electrical linking or connection means 100, 101 and 102 are designed to be plugged directly into the external connection means 96 and 97 with particular layouts for avoiding confusion between the differing connection means. These connection means which consist of parts made, for example, of moulded plastics material, comprising internal electrically conductive plugs having shapes which are adapted to be plugged into the external connection means 96 and 97, can have a plurality of shapes as shown in FIGS. 9, 10, 11 and 12.

Figure 9:
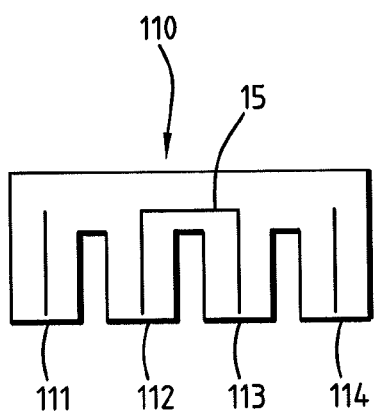
FIG. 9 is a schematic view of a means for connecting a photovoltaic panel.

FIG. 9 shows schematically an external electrical linking means 110 for joining a pole of a generator of a photovoltaic panel and the end return circuit of a series of panels connected in series, as shown in FIG. 6.

This connection element comprises four studs 111, 112, 113 and 114 which contain an electrically conductive jumper 15 for joining the intermediate stud 112 and the intermediate stud 113.

The intermediate connection means between two panels, such as the intermediate connection means 101 in FIG. 8, can assume different shapes, depending on the nature of the electrical links to be produced.

Figure 10:
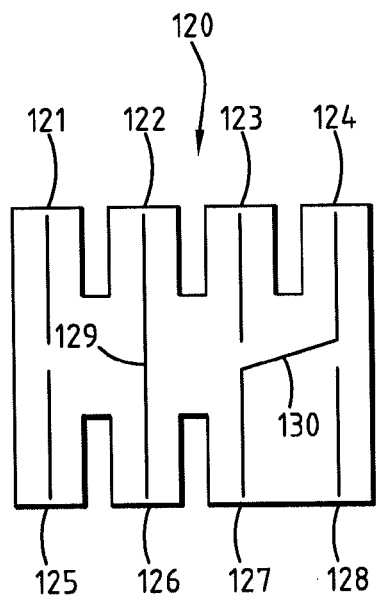
FIGS. 10, 11 and 12 show three embodiments of devices for connecting two adjacent photovoltaic panels.

FIG. 10 shows a connector 120 which constitutes an external electrical linking means for producing a link of the link type 60, shown in FIG. 6, and which includes, on one hand, four studs 121, 122, 123, 124 and, on the other hand, two separate studs 125 and 126 and two studs 127 and 128 which are joined together.

Inside these studs made of plastics material, the connector comprises on the one hand a junction 129 between a stud 122 and a stud 126 which face one another so as to produce junctions between the return circuits of the panels and a third junction 130 which produces the link between an end stud 124 on one hand and an intermediate stud 127 on the other, so as to be able to produce the junction between a positive pole of a first panel and a negative pole of another panel. The studs 127 and 128 are joined so as to provide a means for recognizing the nature of the connector.

Figure 11:
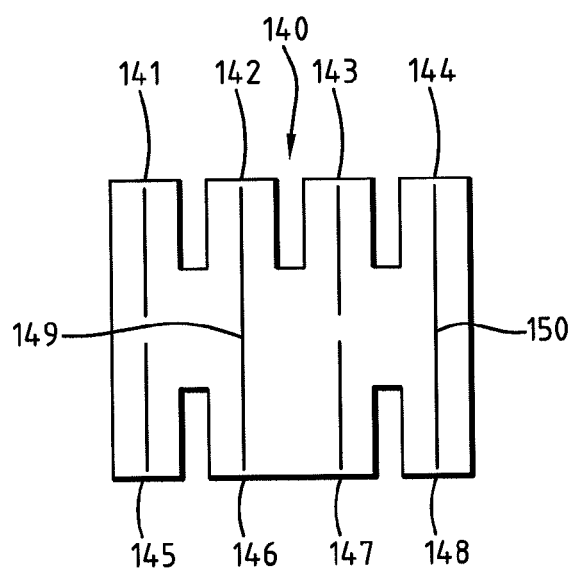

A second type of connector, shown in FIG. 11, may be used to produce the junction 62 between a panel 54 and the load circuit 63, as shown in FIG. 6.

This connector 140 includes, on the one hand, studs 141, 142, 143, 144 which are separated from one another, and, on the other hand, a stud 145 which is separated from two combined studs 146 and 147 and a stud 148. Inside the connector, conductive joining means 149 and 150 allow the linking on the one hand of the studs 142 and 146 and on the other hand of the studs 144 and 148 so as to produce the junctions as shown at the connection 62 in FIG. 6.

The two studs 146 and 147 are combined in a same unit so as also to produce a means of recognizing the connector.

Figure 12:
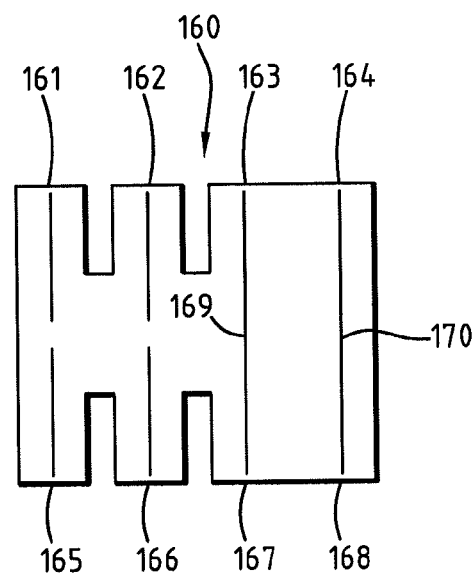

A third embodiment of the connector, shown in FIG. 12, may be used to produce connections of the type of connections 78, 79, 81 or 82 shown in FIG. 7, for producing junctions between two adjacent panels or of one panel with the load circuit when two adjacent panels are connected in parallel.

This connector 160 includes on the one hand studs 161, 162, 163 and 164 and on the other hand studs 165, 166, 167 and 168.

The studs 163 and 167 which face one another are linked by a conductive joining means 169 and the studs 164 and 168 which face one another are linked to one another by a conductive joining means 170.

The studs 163 and 164, on the one hand, and 167 and 168, on the other hand, are combined in a single unit made of plastics material also so as to produce a means of recognizing connection means.

The connectors which have just been described comprise four pairs of studs, only three of which are used.

However, the fourth pair of studs may also be used, for example, for earthing. In this case, the associated studs are electrically connected.

It will be appreciated that these means of connection which are given merely by way of example are standard means which can be used for easy assembly, for example, of the frameworks on a roof or on any wall of a building.

In fact, when the desired method of connection is known, suitable connection means may be selected and, beginning at the bottom, suitable intermediate connection means may be mounted on the studs for connection of the electric power collecting circuit 63 or 80. Once these intermediate connection means are mounted, a first panel may be positioned by plugging the connection means inside the corresponding external connection means of the panel. Once the panel is fixed, a suitable intermediate connection means may be plugged on the second external connection means of the panel. A second panel can then be positioned while ensuring that the intermediate connection means is well plugged into the intermediate connection means of the second panel, and so on, to produce a column of panels which are connected to one another via standardized intermediate connection means which can easily be positioned.

A plurality of columns of interconnected panels can thus be produced, as just mentioned, and an electrical generator consisting of a plurality of photovoltaic panels mounted on the wall of the building can thus easily be produced. This positioning requires minimum of labor.

The person skilled in the art will appreciate that the assembly principle may also be used for electrically active panels other than photovoltaic panels and, in particular, connection means may be provided for independent control of each of the panels by linking them to a general control circuit which allows each of the panels to be powered separately and to be controlled and thus to produce aesthetic effects, for example by using panels capable of becoming electroluminescent.

The invention claimed is:

1. Supporting frame for an electrically active module comprising a peripheral structure for receiving an electrically active module,
    the peripheral structure of which comprises:
        a framework consisting of tubular uprights, each tubular upright having a hollow interior extending substantially along its entire length and enclosed within the periphery of the tubular upright, the frame work delimiting an internal portion of the supporting frame,
        an internal electrical connector for connection to an electrically active module carried by the frame, said internal electrical connector extending through a peripheral wall of a tubular upright of said framework from the hollow interior of the tubular upright to the internal portion of the supporting frame,
        at least one first external electrical connector extending through a peripheral wall of a tubular upright of said framework, such that the at least one first external electrical connector extends from the hollow interior of said tubular upright to the outside of the supporting frame, and
    electrical links for electrically linking at least the internal electrical connector to at least the first external electrical connector, the electrical link extending inside the hollow interior of at least one tubular upright of said framework so as to be concealed inside the peripheral structure,
    wherein the uprights comprise a groove which extends along one of their generatrices, is oriented towards the interior of the framework and is intended to receive the edge of an electrically active panel,
    wherein at least one upright comprises, over its entire length, a fin extending toward the exterior of the framework parallel to a main face of the framework.

2. Frame according to claim 1, wherein a central portion, delimited by the peripheral structure, is open.

3. Frame according to claim 2, wherein the peripheral structure consists of a metal strip which is cut out, folded and joined by welding.

4. Frame according to claim 3, wherein the metal strip consists of a stainless alloy and/or an alloy having a coefficient of expansion compatible with glass.

5. Frame according to claim 1, the frame comprising two external electrical connectors each comprising at least three terminals, wherein the internal electrical connector comprises at least two terminals, each terminal of the internal electrical connector being linked to a terminal of each of the external electrical connectors, and wherein each terminal of one external electrical connector not linked to a terminal of the internal electrical connector is electrically linked to a terminal of the other external electrical connector not linked to a terminal of the internal electrical connector.

6. Frame according to claim 5, wherein the internal electrical connector comprises at least two resilient female half-loops in which male connecting studs of an active electrical panel may be plugged.

7. Frame according to claim 6, wherein the electrically active pane is a photovoltaic generator.

8. Frame according to claim 5, wherein the electrically active panel is a photovoltaic generator.

9. External wall of a building comprising a plurality of frames according to claim 1, disposed side by side, and wherein at least two adjacent frames are connected to one another by an external electrical link which cooperates on the one hand with an external electrical connector of one frame and on the other hand with an external connector of the other frame.

10. External wall of a building according to claim 9, wherein at least one frame carries an electrically active panel.

11. External wall of a building according to claim 10, wherein the electrically active panel is a photovoltaic generator.

12. External wall of a building according to claim 11, wherein the external wall forming a roof element.

13. External wall of a building according to claim 10, wherein the external wall forming a roof element.

14. External wall of a building according to claim 9, wherein the external wall forming a roof element.

15. A supporting frame for an electrically active panel according to claim 1, wherein the at least one first external electrical connector extends through the peripheral wall in a direction that is perpendicular to an axial direction of the tubular upright.

16. Supporting frame for an electrically active module comprising a peripheral structure for receiving an electrically active module,
   the peripheral structure of which comprises:
      a framework consisting of tubular uprights, each tubular upright having a hollow interior extending substantially along its entire length and enclosed within the periphery of the tubular upright, the frame work delimiting an internal portion of the supporting frame,
      an internal electrical connector for connection to an electrically active module carried by the frame, said internal electrical connector extending through a peripheral wall of a tubular upright of said framework from the hollow interior of the tubular upright to the internal portion of the supporting frame,
      at least one first external electrical connector extending through a peripheral wall of a tubular upright of said framework, such that the at least one first external electrical connector extends from the hollow interior of said tubular upright to the outside of the supporting frame, and
      electrical links for electrically linking at least the internal electrical connector to at least the first external electrical connector, the electrical links extending inside the hollow interior of at least one tubular upright of said framework so as to be concealed inside the peripheral structure,
      wherein the frame comprises two external electrical connectors each comprising at least three terminals, wherein the internal electrical connector comprises at least two terminals, each terminal of the internal electrical connector being linked to a terminal of each of the external electrical connectors and wherein each terminal of one external electrical connector not linked to a terminal of the internal electrical connector is electrically linked to a terminal of the other external electrical connector not linked to a terminal of the internal electrical connector.

17. Supporting frame for an electrically active panel according to claim 16, wherein the uprights comprise a groove which extends along one of their generatrices, is oriented towards the interior of the framework and is intended to receive the edge of an electrically active panel.

18. Supporting frame for an electrically active module according to claim 17, wherein at least one upright comprises, over its entire length, a fin extending toward the exterior of the framework parallel to a main face of the framework.

19. Frame according to claim 16, wherein a central portion, delimited by the peripheral structure, is open.

20. Frame according to claim 19, wherein the peripheral structure consists of a metal strip which is cut out, folded and joined by welding.

21. Frame according to claim 20, wherein the metal strip consists of a stainless alloy and/or an alloy having a coefficient of expansion compatible with glass.

22. Frame according to claim 16, wherein the internal electrical connector comprises at least two resilient female half-loops in which male connecting studs of an active electrical panel may be plugged.

23. Frame according to claim 22, wherein the electrically active pane is a photovoltaic generator.

24. Frame according to claim 16, wherein the electrically active panel is a photovoltaic generator.

25. External wall of a building, the external wall comprising a plurality of frames according to claim 16, disposed side by side, and wherein at least two adjacent frames are connected to one another by an external electrical link which cooperates on the one hand with an external electrical connector of one frame and on the other hand with an external connector of the other frame.

26. External wall of a building according to claim 25, wherein at least one frame carries an electrically active panel.

27. External wall of a building according to claim 26, wherein the electrically active panel is a photovoltaic generator.

28. External wall of a building according to claim 26, the external wall forming a roof element.

29. External wall of a building according to claim 27, the external wall forming a roof element.

30. External wall of a building according to claim 25, the external wall forming a roof element.

31. A supporting frame for an electrically active panel according to claim 16, wherein the at least one first external electrical connector extends through the peripheral wall in a direction that is perpendicular to an axial direction of the tubular upright.

* * * * *